United States Patent [19]

Matsumoto et al.

[11] Patent Number: 5,028,702
[45] Date of Patent: Jul. 2, 1991

[54] DUST-PROOF FILM

[75] Inventors: Muneyuki Matsumoto, Yamaguchi; Hiroaki Nakagawa, Iwakuni, both of Japan

[73] Assignee: Mitsui Petrochemical Industries, Ltd., Tokyo, Japan

[21] Appl. No.: 262,809

[22] Filed: Oct. 26, 1988

[30] Foreign Application Priority Data

Oct. 26, 1987 [JP]  Japan ................................. 62-269888
Nov. 18, 1987 [JP]  Japan ................................. 62-290882

[51] Int. Cl.$^5$ ............................................... C08B 3/26
[52] U.S. Cl. .......................................... 536/65; 536/58
[58] Field of Search ............................ 536/58, 65, 68

[56] References Cited

U.S. PATENT DOCUMENTS 4,289,839  9/1981  DiPoppo ........................... 430/177

*Primary Examiner*—Merrell C. Cashion, Jr.
*Assistant Examiner*—Carlos Azpuru
*Attorney, Agent, or Firm*—Sherman and Shalloway

[57] ABSTRACT

A dust-proof film is made from a material which contains a cellulose ester and whose transmittances of light having a wavelength of 365 nm and a wavelength of 436 are 98% or more, or the dust-proof film is formed of cellulose propionate whose weight average molecular weight using polystyrene as a reference is 60,000–400,000. The dust-proof film has a long life and excels in light resisting properties with respect to the i-line. In addition, the dust-proof film is useful as a long-life pellicle for a broad line and exhibits high light transmittance properties with respect to both the i-line and the g-line.

3 Claims, 1 Drawing Sheet

1

DUST-PROOF FILM

The present invention relates to a dust-proof film for preventing dust particles and mote in the atmosphere from adhering to photomasks and reticles directly.

In the production of semiconductors such as LSIs, it is necessary to prevent dust particles from adhering to photomasks in the process of lithography in which a pattern of a photomask is transferred onto a photoresist on silicon wafers. For this purpose, a dust-proof film has been used for protecting the photomask from dust particles and mote.

As such a dust-proof film, a thin film formed of nitrocellulose, cellulose acetate butyrate, alkyl cellulose or the like has conventionally been used.

Meanwhile, exposure apparatus (steppers) used in photolithography include an i-line stepper having a wavelength of 365 nm (i-line) and a g-line stepper having a wavelength of 436 nm (g-line), and these two steppers are used properly, as required.

In terms of the performance required of such a dust-proof film, the dust-proof film should possess high light transmission properties at a wavelength of 365 nm of i-line and 436 nm of g-line and good light resisting properties, i.e. no changes in chemical or physical properties even after application of light irradiation for long periods of time. However, the conventional dust-proof films have variable penetration properties. More particularly, some dust-proof films display slight absorbing properties with respect to light having the wavelength of 365 nm (i-line) used in photolithography and has poor light resisting properties with respect to the light having a wavelength adjacent thereto. Also, there is another dust-proof film which displays high light transmission properties with respect to the i-line, but does not display high light transmission properties with respect to the g-line. There is still another type which, conversely, displays high light transmission properties with respect to the g-line, but does not display high light transmission properties with respect to the i-line. Hence, there is the drawback that dust-proof films which are respectively suited to the i-line stepper or the g-line stepper must be prepared and must be used properly.

SUMMARY OF THE INVENTION

Accordingly, an object of the present invention is to provide a dust-proof film which displays high light transmission properties with respect to both a wavelength of 365 nm for the i-line and a wavelength of 436 nm for the g-line, in particular, and which excels in light resisting properties and has a long life, thereby overcoming the above-described drawbacks of the conventional art.

To this end, in accordance with one aspect of the present invention, there is provided a dust-proof film made of a material containing cellulose ester whose transmittances of light having a wavelength of 365 nm and a wavelength of 436 nm are 98% or more, respectively.

The aforementioned cellulose ester is cellulose propionate, and the effect of the present invention is demonstrated to a maximum when the film thickness falls in any of the following ranges: 0.72–0.75 $\mu$m, 1.45–1.48 $\mu$m, 2.18–2.21 $\mu$m, 2 92–2.95 $\mu$m, 3.65–3.68 $\mu$m, and 4.39–4.41 $\mu$m, weight average molecular weight using polystyrene as a reference is 60,000–470,000.

A dust-proof film in accordance with another aspect of the invention is one formed of cellulose propionate whose weight average molecular weight using polystyrene as a reference is 60,000–470,000.

DESCRIPTION OF THE PREFERRED EMBODIMENT

Figure 1:
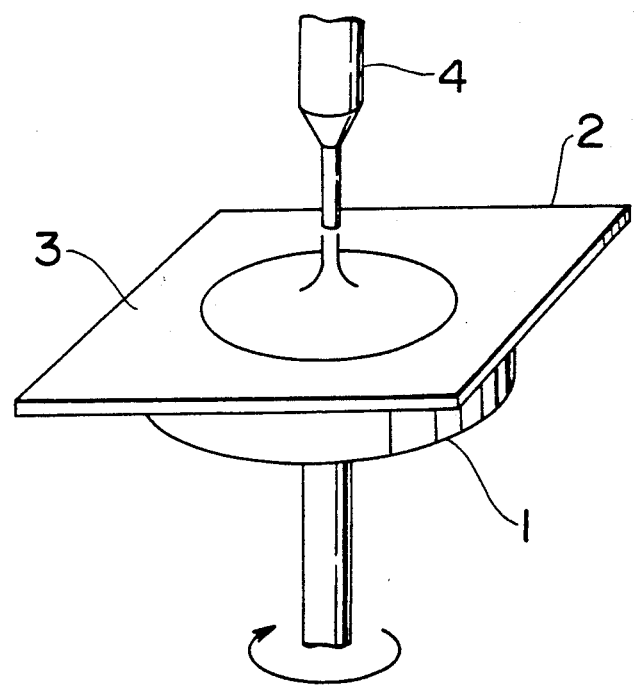
FIG. 1 is a perspective view of an apparatus which is used in a method of producing a thin film of cellulose propionate in accordance with the present invention.

A dust-proof film which is formed substantially of cellulose propionate and which has a film thickness selected from within one of the following ranges: 0.72–0.75 $\mu$m, 1.45–1.48 $\mu$m, 2.18–2.21 $\mu$m, 2.92–2.95 $\mu$m, 3.65–3.68 $\mu$m, and 4.39–4.41 $\mu$m is used according to the present invention and such dust-proof films are characterized by light transmittances with respect to light having wavelengths of 365 nm and 436 nm of 98% or above.

Since the transmittances of light having wavelengths of 365 nm and 436 nm are 98% or above, respectively, the dust-proof film in accordance with the present invention can be used for both the i-line stepper and the g-line stepper.

The dust-proof film in accordance with the present invention can be produced from an organic solvent solution for cellulose propionate by a rotational film-forming method. A ketone-based solvent including methyl isobutyl ketone (MIBK), acetone, methyl ethyl ketone, methyl propyl ketone, dimethyl ketone, diisobutyl ketone, cyclopentane, cyclohexanone, or diacetone alcohol can be suitably used as an organic solvent for cellulose propionate. The most efficient solvent is selected to obtain a desired film thickness and uniformity in the film thickness.

It goes without saying that organic solvents are not confined to those described above, and it should be appreciated that, for instance, alcohols such as methanol and ethanol, ethers such as tetrahydrofuran, 1,2-dimethoxyethane and 1,2-diethoxyethane, and esters such as ethyl acetate, propyl acetate, ethyl lactate, butyl formate and butyl acetate can be used singly or in a combination of two or more kinds thereof.

The weight ratio of cellulose propionate to the solvent such as methyl isobutyl ketone should be in the range of 1:30 to 1:10, preferably 1:20 to 1:10.

A solution of this cellulose propionate may be used as it is, and a film may be formed by the rotational film-forming method. However, it is preferred that a thin film is formed after the solution of cellulose propionate is subjected to filtration so as to remove foreign substances. As for the filtration, a pressurized filtration method using, for instance, a 0.2 $\mu$m filter may be used.

In addition, if substances of high molecular weight are removed in advance from the solution of cellulose propionate by a fractional precipitation method, the distribution of the thickness of the film produced becomes uniform, and optical characteristics improve noticeably.

Furthermore, a second organic solvent which displays compatibility with the aforementioned organic solvent but is a poor solvent with respect to cellulose propionate may be added to the aforementioned organic solvent solution of cellulose propionate so as to precipitate high molecular-weight cellulose contained in the cellulose propionate, preferably as well as gel-like substances, impurities having a low degree of solubility, and the like together with the high molecular-weight components, thereby separating the high molecular-weight cellulose propionate from the aforementioned solution, and a film may be formed by the rotational film-forming method by using the cellulose propionate solution after separation.

If high molecular-weight components are thus removed through fractional precipitation or by using a poor solvent, it is possible to enhance the stability, filtering properties, and film-forming performance of the raw-material solution for film formation, and it is possible to uniformalize the thickness of the film thus obtained and appreciably improve the optical characteristics thereof.

If, in accordance with a preferred embodiment of the present invention, the cellulose propionate solution before addition of a poor solvent thereto is mixed with methyl alcohol, the speed of precipitation of high molecular-weight cellulose ester becomes fast when the poor solvent is added thereto. The amount of poor solvent added should preferably be more than the total volume of methyl isobutyl ketone and methyl alcohol.

As the poor solvent for cellulose ester, it is possible to cite hexane, heptane, methylcyclohexane, cyclohexane, toluene, octane, solvent naphtha, cyclonaphtha, xylene, or the like. Since it is necessary to desolvate this poor solvent later by heating, a poor solvent whose boiling point is lower than that of the solvent for cellulose propionate, e.g. methyl isobutyl ketone, particularly an aliphatic hydrocarbon or an alicyclic hydrocarbon, including hexane, heptane, methylcyclohexane, and cyclohexane, whose hydrocarbon number is 5 to 10 can be used advantageously. However, hexane can be used more preferably in light of availability and cost.

The amount of the poor solvent to be added is preferably 0.5 to 1.5, more preferably 0.6 to 1.0, in terms of the volume ratio of the poor solvent to the solvent. If the volume of the poor solvent is smaller than that of the solvent such as methyl isobutyl ketone, the precipitating action of the high molecular-weight cellulose propionate and the like cannot take place as desired. When a change in the average molecular weight of, for instance, cellulose propionate was examined by changing the volume ratio of the poor solvent (hexane) and methyl isobutyl ketone, it was found that, the greater the amount of the poor solvent added, the more the average molecular weight of cellulose propionate decreases, i.e., high molecular-weight components are precipitated. However, if the amount of the poor solvent added is excessively large, the yield of the purified cellulose propionate solution becomes small, resulting in deteriorated productivity.

After addition of the poor solvent, a cellulose propionate solution in which only the high molecular-weight cellulose propionate has been removed by such means as decantation or centrifugal separation is obtained, and the residual poor solvent is then desolvated, thereby obtaining a purified cellulose propionate. The desolvating means is carried out by evaporating the poor solvent by heating the cellulose propionate solution at a temperature below the boiling point of methyl isobutyl ketone and above the boiling point of the poor solvent. At that time, the cellulose propionate solution may be held under reduced pressure.

By adjusting the concentration and viscosity of the cellulose propionate solution, the thickness of the film can be changed variously. However, in order to obtain a transmittance of 98% or more with respect to both the light with a wavelength of 365 nm and the light with a wavelength of 436 nm, the film thickness should preferably be 0.72–0.75 $\mu$m, 1.45–1.48 $\mu$m, 2.18–2.21 $\mu$m, 2.92–2.95 $\mu$m, 3.65–3.68 $\mu$m, and 4.39–4.41 $\mu$m, more preferably 1.45 $\mu$m or more and within the above-described ranges in light of the strength and handling efficiency.

A description will now be given of an example of an apparatus used in the rotational film-formation method. As shown in FIG. 1, this apparatus has a substrate 2 for, for example glass, mounted on a turntable 1 which is rotatively driven. This substrate 2 is used as a rotary body, and the upper surface of the substrate 2 is held horizontally to constitute a horizontal surface 3. The cellulose propionate solution is supplied to this horizontal surface 3 from a nozzle 4, and the turntable 1 is rotated. Then, the substrate 2 also rotates, and the cellulose propionate solution spreads thinly along the horizontal surface 3 by means of a centrifugal force thereof, thereby forming a thin film of cellulose propionate.

The rotational speed of the substrate 2 is normally 400–4,000 r.p.m., preferably 500–3,000 r.p.m. However, instead of rotating the substrate 2 at a fixed speed, the rotational speed during rising may be set to a low speed (200–1,000 r.p.m.), and may be set to a high speed (400–4,000 r.p.m.) midway during the rotation. In addition, if a releasing agent is applied in advance to the horizontal surface 3 of the substrate 2, the exfoliation of the thin film from the horizontal surface 3 can be facilitated.

A description will be given hereafter of examples of the present invention and comparative examples.

EXAMPLE 1

133 g of cellulose propionate (a high molecular weight grade made by Aldrich Co., Ltd.) was dissolved in 1761 g of cyclohexane and was filtered with a 0.20 $\mu$m filter. This solution was cast over a glass substrate, and a film was formed by rotating the glass substrate at 780 r.p.m. Subsequently, after the film was allowed to dry at 140° C. for five minutes, the film was exfoliated from the glass substrate, and was adhered to a support frame made of aluminum. The thickness of the film obtained was 1.462 $\mu$m, and the light transmittance measured using a spectrophotometer was 99.6% with respect to the light with a wavelength of 365 nm and 99.8% with respect to the light with a wavelength of 436 nm.

EXAMPLE 2

80 g of cellulose propionate (a high molecular weight grade made by Aldrich Co., Ltd.) was dissolved in 720 g of methyl isobutyl ketone, and hexane was dropped to this solution while being agitated. A supernatant liquid thereof after the solution was left to stand overnight was filtered with a 1 $\mu$m filter to remove the solvent. 370 g of methyl isobutyl ketone was added to the filtered portion to obtain a solution, and this solution was then filtered with a 0.20 $\mu$m filter. This solution was cast over a glass substrate, and a film was formed by rotating the glass substrate at 220 r.p.m. Subsequently, after the film was allowed to dry at 100° C. for five minutes, the film was exfoliated from the glass substrate and was adhered to the aluminum support frame. The thickness of the film obtained was 2.205 $\mu$m, and the light transmittance measured using a spectrophotometer was 99.1% with respect to the light with a wavelength of 365 nm and 99.0% with respect to the light with a wavelength of 436 nm.

EXAMPLES 3-5

In the same way as Example 2, films respectively having the thickness of 2.928 μm, 3.661 μm and 4,396 μm were produced, and their light transmittances were measured. The results are shown in Table 1.

Comparative Example 1

140 g of cellulose propionate (a high molecular weight grade made by Aldrich Co., Ltd.) was dissolved in 1,828 g of cyclohexane and was filtered with a 0.45 μm filter. This solution was cast over a glass substrate, and a film was formed by rotating the glass substrate at 410 r.p.m. Subsequently, after the film was allowed to dry at 130° C. for five minutes, the film was exfoliated from the glass substrate, and was adhered to the aluminum support frame. The thickness of the film obtained was 2.30 μm, and the light transmittance measured using a spectrophotometer was 93.2% with respect to the light with a wavelength of 365 nm and 89.3% with respect to the light with a wavelength of 436 nm.

Comparative Example 2

Using a solution prepared in the same way as Example 2, a film was formed by rotating a glass substrate at 300 r.p.m., similar post-treatment was then provided, and a film having a thickness of 1.739 μm was obtained. Its light transmittance measured using a spectrophotometer was 87.1% with respect to the light with a wavelength of 365 nm and 99.9% with respect to the light with a wavelength of 436 nm.

Comparative Examples 3-5

In the same way as Example 2, films respectively having the thickness of 2.590 μm, 3.394 μm and 3.881 μm were produced, and their light transmittances were measured. The results are shown in Table 1.

The dust-proof film in accordance with the present invention can be used for both the i-line stepper and the g-line stepper since its transmittances of light having a wavelength of 365 nm and a wavelength of 436 nm are 98% or more in both cases. Accordingly, since it is unnecessary to produce special dust-proof films corresponding to the i-line stepper and the g-line

| | Thickness μm | Transmittance of 365 nm light (%) | Transmittance of 436 nm light (%) |
|---|---|---|---|
| Example 1 | 1.462 | 99.6 | 99.8 |
| Example 2 | 2.205 | 99.1 | 99.0 |
| Example 3 | 2.928 | 99.8 | 99.2 |
| Example 4 | 3.661 | 99.8 | 99.0 |
| Example 5 | 4.396 | 99.1 | 99.9 |
| Comparative Example 1 | 2.30 | 93.2 | 89.3 |
| Comparative Example 2 | 1.739 | 87.1 | 99.9 |
| Comparative Example 3 | 2.590 | 98.5 | 88.3 |
| Comparative Example 4 | 3.394 | 87.2 | 97.7 |
| Comparative Example 6 | 3,881 | 87.8 | 87.5 | stepper and to use them properly, the present invention excels in the economic feature and facilitates the process of photolithography.

An example of the present invention will be described below.

EXAMPLE 6

70 g of cellulose propionate (a high molecular weight grade made by Aldrich Co., Ltd.) was dissolved in 930 g of methyl isobutyl ketone to prepare a cellulose propionate solution. 605 g of hexane was added to this cellulose propionate solution by dropping (at this time, the volume of methyl isobutyl ketone is 1,170 ml, and the volume of hexane is 920 ml, the relationship between the two being expressed as 1.27:1 in terms of a volume ratio). After this solution was left to stand for five hours, precipitated high molecular weight cellulose propionate was removed by decantation, and a supernatant liquid thereof was placed under reduced pressure of 15-20 mmHg at 40° C. to desolvate hexane, thereby obtaining a purified cellulose propionate solution.

When this purified cellulose propionate solution was filtered and circulated under the pressure of 0.5 kg/cm$^2$.G by using a filter having a pore diameter of 0.2 μm and a diameter of 142 mm, it was possible to perform filtration for as many as 40 hours without any loading of the filter. In addition, a thin film was produced by the rotational film-forming method by using the filtered cellulose propionate solution.

The weight average molecular weight of the thin film thus obtained was 470,000, the cellulose propionate thin film excelled in optical characteristics and was free of color shading and streaks, and its light transmittance was 99% or more.

Since the dust-proof film of the present invention has extremely good transparency and outstanding light resisting properties, the present invention has excellent advantages in that the dust-proof film can sufficiently demonstrate its performance and that its life is more than double a nitrocellulose-made dust-proof film.

Accordingly, the dust-proof film in accordance with the present invention is very useful as a long-life pellicle for a broad line.

We claim:

1. A dust-proof film consisting essentially of cellulose propionate having a weight average molecular weight using polystyrene as a reference of from 60,000 to 470,000 and having a film thickness falling within one of the following ranges: 0.72-0.75 μm, 1.45-1.48 μm, 2.18-2.21 μm, 2.92-2.95 μm, 3.65-3.68 μm and 4.39-4.41 μm.

2. A dust-proof film according to claim 1 whose transmittances of light having a wavelength of 365 nm and a wavelength of 436 nm are 98% or more, respectively.

3. A dust-proof film according to claim 1, wherein said film thickness is at least 1.45 μm.

* * * * *